United States Patent
Endo et al.

(10) Patent No.: US 11,927,615 B2
(45) Date of Patent: Mar. 12, 2024

(54) MOBILE TERMINAL TESTING DEVICE AND MOBILE TERMINAL TESTING METHOD

(71) Applicant: ANRITSU CORPORATION, Kanagawa (JP)

(72) Inventors: Hideyuki Endo, Kanagawa (JP); Hironori Watanabe, Kanagawa (JP); Takumi Nakamura, Kanagawa (JP); Yui Yoshida, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 381 days.

(21) Appl. No.: 17/321,787

(22) Filed: May 17, 2021

(65) Prior Publication Data

US 2021/0364563 A1 Nov. 25, 2021

(30) Foreign Application Priority Data

May 20, 2020 (JP) ................................ 2020-088250

(51) Int. Cl.
*G01R 29/08* (2006.01)
*G01R 29/10* (2006.01)
*H04B 17/00* (2015.01)

(52) U.S. Cl.
CPC ....... *G01R 29/0821* (2013.01); *G01R 29/105* (2013.01); *H04B 17/0085* (2013.01); *H04B 17/0087* (2013.01)

(58) Field of Classification Search
CPC .............. G01R 29/0821; G01R 29/105; H04B 17/0085; H04B 17/0087; H04B 17/102
See application file for complete search history.

(56) References Cited

U.S. PATENT DOCUMENTS

| | | | |
|---|---|---|---|
| 10,404,384 B1* | 9/2019 | Mellein | H04W 24/06 |
| 10,826,624 B1* | 11/2020 | Lin | H04B 7/10 |
| 11,251,879 B1* | 2/2022 | Wu | H04B 17/29 |
| 2017/0222735 A1* | 8/2017 | Kawamura | H04B 17/0085 |
| 2018/0172747 A1* | 6/2018 | Qi | G01R 29/0821 |
| 2018/0329017 A1* | 11/2018 | Morita | G01S 3/38 |
| 2019/0036621 A1* | 1/2019 | Vanwiggeren | G01R 29/105 |
| 2021/0399811 A1* | 12/2021 | Endo | H04B 17/15 |

(Continued)

FOREIGN PATENT DOCUMENTS

| | | |
|---|---|---|
| JP | 2008-064704 A | 3/2008 |
| JP | 2009-031209 A | 2/2009 |
| JP | 2019-138687 A | 8/2019 |

*Primary Examiner* — Seokjin Kim
(74) *Attorney, Agent, or Firm* — Pearne & Gordon LLP

(57) ABSTRACT

A measuring device 1 includes a DUT scanning mechanism 56 that is provided in the OTA chamber 50, includes a biaxial positioner which can be rotationally driven by drive motors 56*f* and 56*g*, and rotates a DUT 100 to sequentially face all preset directions of a spherical coordinate system; an integrated control device 10 that measures the DUT 100 at each measurement position corresponding to each of the all directions; and a rotation speed management control unit 18*b* that controls a rotation speed of the drive motors 56*f* and 56*g* at a rotation speed which shortens a time required for the movement in a case where the biaxial positioner is moved at a unit step angle from a measurement position where the measurement is completed to a measurement position where next measurement is performed during the DUT 100 is measured.

8 Claims, 12 Drawing Sheets

(56) References Cited

U.S. PATENT DOCUMENTS

| | | | | |
|---|---|---|---|---|
| 2022/0006535 A1* | 1/2022 | Wu | ............... | H04B 17/15 |
| 2022/0038197 A1* | 2/2022 | Endo | ............... | H04B 17/23 |
| 2022/0236316 A1* | 7/2022 | Nakamura | ............... | H04B 17/29 |
| 2022/0255641 A1* | 8/2022 | Wu | ............... | H04B 17/0085 |
| 2022/0393753 A1* | 12/2022 | Nakayama | ............... | H04B 7/0617 |

\* cited by examiner

| rpm\step | 5deg | 10deg | 15deg | 30deg |
|---|---|---|---|---|
| 1 | 47.83 | 23.32 | 15.89 | 8.68 |
| 2 | 32.88 | 14.17 | 9.44 | 4.91 |
| 3 | 31.71 | 12.35 | 7.67 | 3.77 |
| 4 | 34.30 | 11.92 | 6.91 | 3.28 |
| 5 | 36.34 | 12.65 | 6.92 | 3.01 |
| 6 | | | 7.33 | 2.94 |
| 7 | | | 7.63 | 2.93 |
| 8 | | | 7.91 | 3.02 |
| 9 | | | 8.16 | 3.12 |
| 10 | | | 8.22 | 3.21 |
| 11 | | | 8.59 | 3.28 |
| 12 | | | 8.79 | 3.35 |
| 13 | | | 8.98 | 3.39 |
| 14 | | | 9.13 | 3.50 |
| 15 | | | 9.30 | 3.56 |

MOBILE TERMINAL TESTING DEVICE AND MOBILE TERMINAL TESTING METHOD

TECHNICAL FIELD

The present invention relates to a mobile terminal testing device and a mobile terminal testing method for performing a test on a mobile terminal by exchanging signals while changing an angle of a positioner on which the mobile terminal is installed under Over The Air (OTA) environment.

BACKGROUND ART

For wireless terminals that are developed in recent years and transmit and receive radio signals corresponding to IEEE802.11ad, 5G cellular, and the like, in which wideband signals in a millimeter wave band are used, a performance test is performed that measures an output level and reception sensitivity of a transmitted radio wave determined for each communication standard with respect to antennas for wireless communication provided in the wireless terminals, and determines whether or not a predetermined reference is satisfied.

For example, in a performance test in which a wireless terminal for a 5G New Radio (NR) system (hereinafter, referred to as a 5G wireless terminal) is used as a Device Under Test (DUT), an OTA test is performed using a radio anechoic box (OTA chamber) called a Compact Antenna Test Range (CATR) which is not affected by a surrounding radio wave environment.

As an example of a wireless terminal measuring device capable of performing the OTA test according to the related art, a device is known (for example, refer to Patent Document 1) which rotates the wireless terminal around a reference point in a measurement space, such as a radio anechoic box or a radio anechoic chamber, receives a radio wave transmitted from the wireless terminal using a measurement antenna, and obtains a radiated power characteristic of the wireless terminal (Equivalent Isotropic Radiated Power (EIRP), Equivalent Isotropic Sensitivity (EIS), Total Radiated Power (TRP), or the like) from the received signal.

The wireless terminal measuring device according to the related art adopts a terminal holding rotation mechanism (paragraph 0023) including, as a mechanism for rotating a wireless terminal device in accordance with measurement of the radiated power characteristic (EIRP, EIS, TRP, or the like), a first rotation drive device that gives rotation around a horizontal axis H passing through a reference point O in a state of holding a wireless terminal; and a second rotation drive device that integrally holds the wireless terminal and the first rotation drive device, and gives rotation to the wireless terminal around a vertical axis passing through the reference point O, in which it is possible to rotate the wireless terminal at a predetermined angle step (for example, 10 degrees) around the vertical axis and the horizontal axis by using the first rotation drive device and the second rotation drive device.

RELATED ART DOCUMENT

Patent Document

[Patent Document 1] JP-A-2019-138687

DISCLOSURE OF THE INVENTION

Problem that the Invention is to Solve

In a mobile terminal testing device that adopts a terminal holding rotation mechanism (positioner), measurement related to a specific measurement item, such as TRP, of a mobile terminal is performed in a procedure (for example, control by software) of setting an angle (angle between angular sample points PS, hereinafter, referred to as "unit movement angle"), which is moved once on, for example, a spherical coordinate system (refer to FIG. 5), and, thereafter, measuring a DUT for each measurement position while sequentially moving the positioner from an initial measurement position (angular sample point PS) to a next measurement position at the set unit movement angle.

In the mobile terminal testing device according to the related art, such as the wireless terminal testing device disclosed in Patent Document 1, in a case where the above-described positioner is moved at the unit movement angle, a method is generally used for rotationally driving a drive motor of the positioner at the maximum rotation speed, for example, 15 rpm in a table of FIG. 9.

However, even in a case where the drive motor of the positioner is rotationally driven at the maximum rotation speed, a time required for movement at the unit movement angle is not always the shortest, depending on the unit movement angle specified in a case where the measurement is performed.

Therefore, in the mobile terminal testing device according to the related art, there is a case where a delay in the time required for the positioner to move at the unit movement angle affects a total measurement time over all measurement positions (a plurality of preset measurement positions). In particular, in TRP measurement, the number of measurement positions is large and the number of movements of the positioner by the unit movement angle increases according to the number of measurement positions. Therefore, the delay in the time required for the positioner to move at each unit movement angle accumulates, so that there is a problem in that the total measurement time becomes long.

The present invention has been made to solve such a conventional problem, and an object of the present invention is to provide a mobile terminal testing device and a mobile terminal testing method capable of optimizing a rotation speed of a drive motor related to movement of a positioner by a unit movement angle and is capable of shortening a total measurement time of the mobile terminal over all measurement positions.

Means for Solving the Problem

In order to solve the above problems, according to a first aspect of the present invention, there is provided a mobile terminal testing device including: a positioner (56) that includes an azimuth axis and a roll axis each of which can be rotationally driven by a drive motor (56*f*, 56*g*), and rotates a mobile terminal which is a device under test to sequentially face a plurality of preset directions of a spherical coordinate system using a center of the spherical coordinate system as a reference point; a simulated measuring device (20) that is connected to a test antenna (5); measurement control means (10) for controlling the simulated measuring device to perform a measurement operation of transmitting a test signal from the test antenna to the mobile terminal (100), receiving a measured signal transmitted from the mobile terminal which receives the test signal by the test antenna, and measuring a specific measurement item related to the mobile terminal based on the received measured signal at each measurement position corresponding to each of the plurality of directions; and rotation speed control means (18b) for controlling a rotation speed of the drive motor to be a rotation speed which is smaller than a maximum rotation speed and shortens a time required for the positioner to move at a unit movement angle in a case where the positioner is moved at an angle from the measurement position where the measurement is completed to the measurement position where next measurement is performed as the unit movement angle during the specific measurement item is measured.

With the configuration, in the mobile terminal testing device according to the first aspect of the present invention, it is possible to shorten the movement time of the positioner at the unit movement angle by controlling the rotation speed of the drive motor, so that it is possible to shorten a total measurement time of a specific item of the mobile terminal over a plurality of set measurement positions, compared to a case where the drive motor is always rotationally driven at the maximum speed during the movement at the unit movement angle.

Further, the mobile terminal testing device according to a second aspect of the present invention may further include a rotation speed management table (16b) that stores the rotation speed of the drive motor, which can minimize a movement time of the positioner at each unit movement angle, so as to correspond to a plurality of the different unit movement angles; and setting means (18a) for setting the unit movement angle, in which, in a case where the positioner is moved at the unit movement angle set by the setting means, the rotation speed control means rotationally drives the drive motor at the rotation speed stored in the rotation speed management table so as to correspond to the set unit movement angle.

With the configuration, in the mobile terminal testing device according to the second aspect of the present invention, it is possible to easily realize optimization of the rotation speed of the drive motor that minimizes the movement time of the positioner at the unit movement angle by using the rotation speed management table.

Further, in the mobile terminal testing device according to a third aspect of the present invention, the positioner may include a first drive motor (56f) that rotationally drives the azimuth axis and a second drive motor (56g) that rotationally drives the roll axis, and the rotation speed management table stores a rotation speed of the first drive motor, a rotation speed of the second drive motor, or both the rotation speed of the first drive motor and the rotation speed of the second drive motor, the rotation speed minimizing the movement time of the positioner at each unit movement angle so as to correspond to the plurality of unit movement angles.

With the configuration, in the mobile terminal testing device according to the third aspect of the present invention, in addition to management in which the rotation speeds of the first drive motor that rotationally drives the azimuth axis and the second drive motor that rotationally drives the roll axis are individually optimized, management in which the rotation speeds of both the first drive motor and the second drive motor are simultaneously optimized is possible. Therefore, it is possible to shorten the total measurement time of the specific measurement item of the mobile terminal in either management.

Further, in the mobile terminal testing device according to a fourth aspect of the present invention, the measurement control means may control the simulated measuring device so as to measure Total Radiated Power (TRP) as the specific measurement item.

With the configuration, in the mobile terminal testing device according to fourth aspect of the present invention, in TRP measurement in which the number of measurement positions is enormous, it is possible to significantly shorten the total measurement time overall the measurement positions due to accumulation of effects of shortening the movement time of the positioner for each unit movement angle.

Further, in the mobile terminal testing device according to a fifth aspect of the present invention, the rotation speed control means may control the rotation speed of the drive motor to be an optimal rotation speed in order to minimize the time required for the positioner to move at the unit movement angle. With the configuration, in the mobile terminal testing device according to the fifth aspect of the present invention, it is possible to shorten the movement time of the positioner at the unit movement angle by optimizing the rotation speed of the drive motor, so that it is possible to shorten a total measurement time of a specific item of the mobile terminal over a plurality of set measurement positions, compared to a case where the drive motor is always rotationally driven at the maximum speed during the movement at the unit movement angle.

Further, the mobile terminal testing device according to a sixth aspect of the present invention may further include a radio anechoic box including an internal space, in which the positioner and the test antenna may be provided in the internal space.

Further, in order to solve the above problems, according to a seventh aspect of the present invention, there is provided a mobile terminal testing method of a mobile terminal testing device, which includes a positioner (56) that includes an azimuth axis and a roll axis each of which can be rotationally driven by a drive motor, and rotates a mobile terminal which is a device under test to sequentially face a plurality of preset directions of a spherical coordinate system using a center of the spherical coordinate system as a reference point; a simulated measuring device (20) that is connected to a test antenna (5); and measurement control means (10) for controlling the simulated measuring device to perform a measurement operation of transmitting a test signal from the test antenna to the mobile terminal (100), receiving a measured signal transmitted from the mobile terminal which receives the test signal by the test antenna, and measuring a specific measurement item related to the mobile terminal based on the received measured signal at each measurement position corresponding to each of the plurality of directions, the mobile terminal testing method including: a movement control step (S3) of moving the positioner at an angle from the measurement position where the measurement is completed to the measurement position where next measurement is performed as a unit movement angle during the specific measurement item is measured; and a rotation speed control step (S20) of controlling a rotation speed of the drive motor to be a rotation speed which shortens a time required for the positioner to move at the unit movement angle in a case where the positioner is moved in the movement control step.

With the configuration, in the mobile terminal testing method according to the seventh aspect of the present invention, it is possible to shorten the movement time of the positioner at the unit movement angle by controlling the rotation speed of the drive motor, so that it is possible to shorten a total measurement time of a specific item of the mobile terminal over a plurality of set measurement positions, compared to a case where the drive motor is always rotationally driven at the maximum speed during the movement at the unit movement angle.

Further, the mobile terminal testing method according to an eighth aspect of the present invention may further include a step (S11) of preparing a rotation speed management table (16b) that stores the rotation speed of the drive motor, which can minimize a movement time of the positioner at each unit movement angle, so as to correspond to a plurality of the different unit movement angles, in which the rotation speed control step includes a setting step (S11) of setting the unit movement angle; and a drive step (S12, S13) of rotationally driving the drive motor at the rotation speed stored in the rotation speed management table so as to correspond to the set unit movement angle in a case where the positioner is moved at the unit movement angle set in the setting step.

With the configuration, in the mobile terminal testing method according to the eighth aspect of the present invention, it is possible to easily realize optimization of the rotation speed of the drive motor that minimizes the movement time of the positioner at the unit movement angle by using the rotation speed management table.

Advantage of the Invention

The present invention can provide a mobile terminal testing device and a mobile terminal testing method capable of optimizing a rotation speed of a drive motor related to movement of a positioner by a unit movement angle and is capable of shortening a total measurement time of the mobile terminal over all measurement positions.

BRIEF DESCRIPTION OF THE DRAWINGS

FIGS. 5A and 5B are diagrams showing a total spherical scanning image of a DUT in an OTA chamber of the measuring device according to the embodiment of the present invention, in which FIG. 5A shows a disposition mode of the DUT with respect to a center of a spherical coordinate system, and FIG. 5B shows a distribution mode of angular sample points PS in the spherical coordinate system.

BEST MODE FOR CARRYING OUT THE INVENTION

Hereinafter, an embodiment of a mobile terminal testing device according to the present invention and a mobile terminal testing method using the same will be described with reference to the accompanying drawings.

Figure 1:
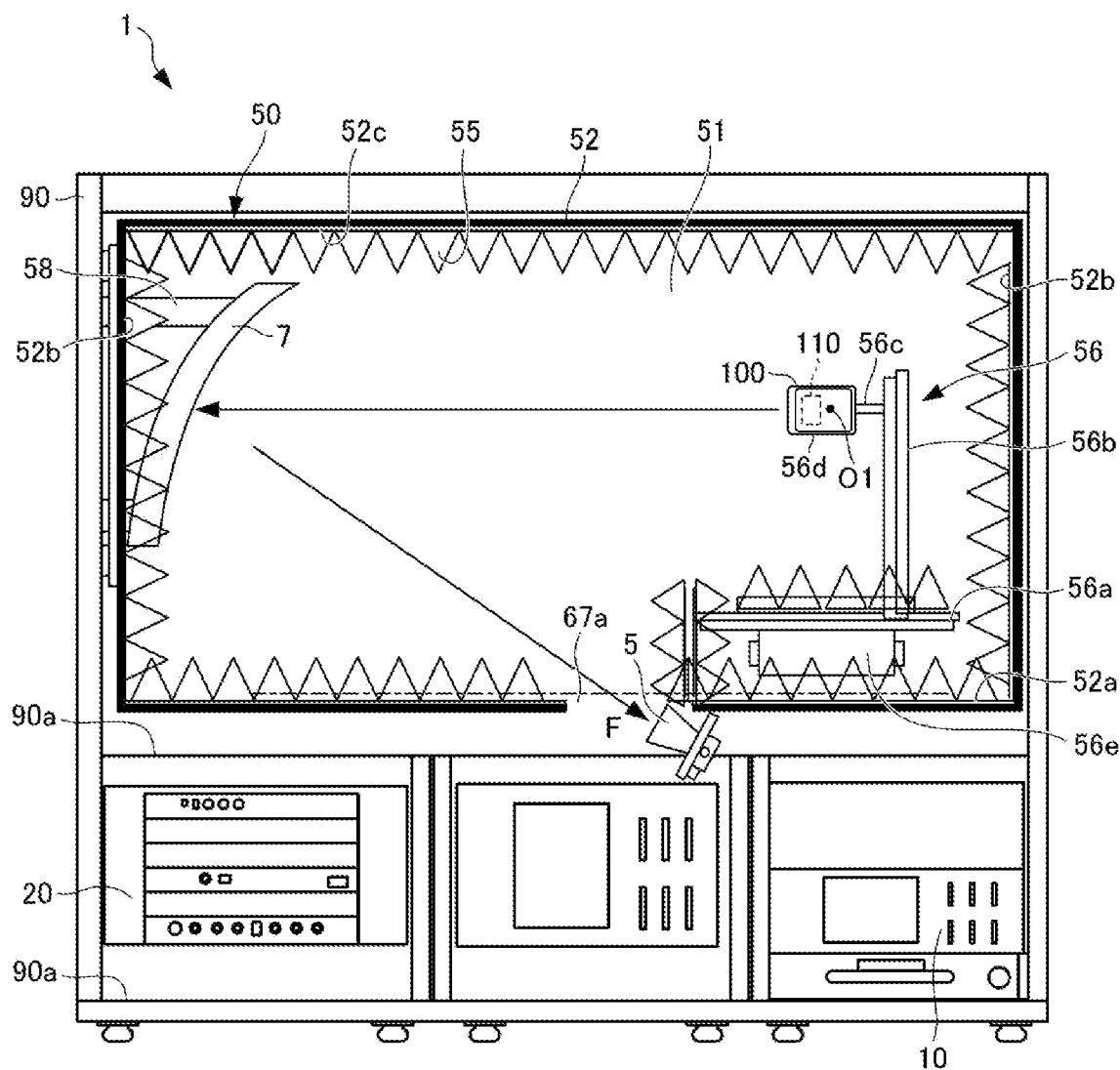
FIG. 1 is a diagram showing a schematic configuration of an entire measuring device according to an embodiment of the present invention.
Figure 2:
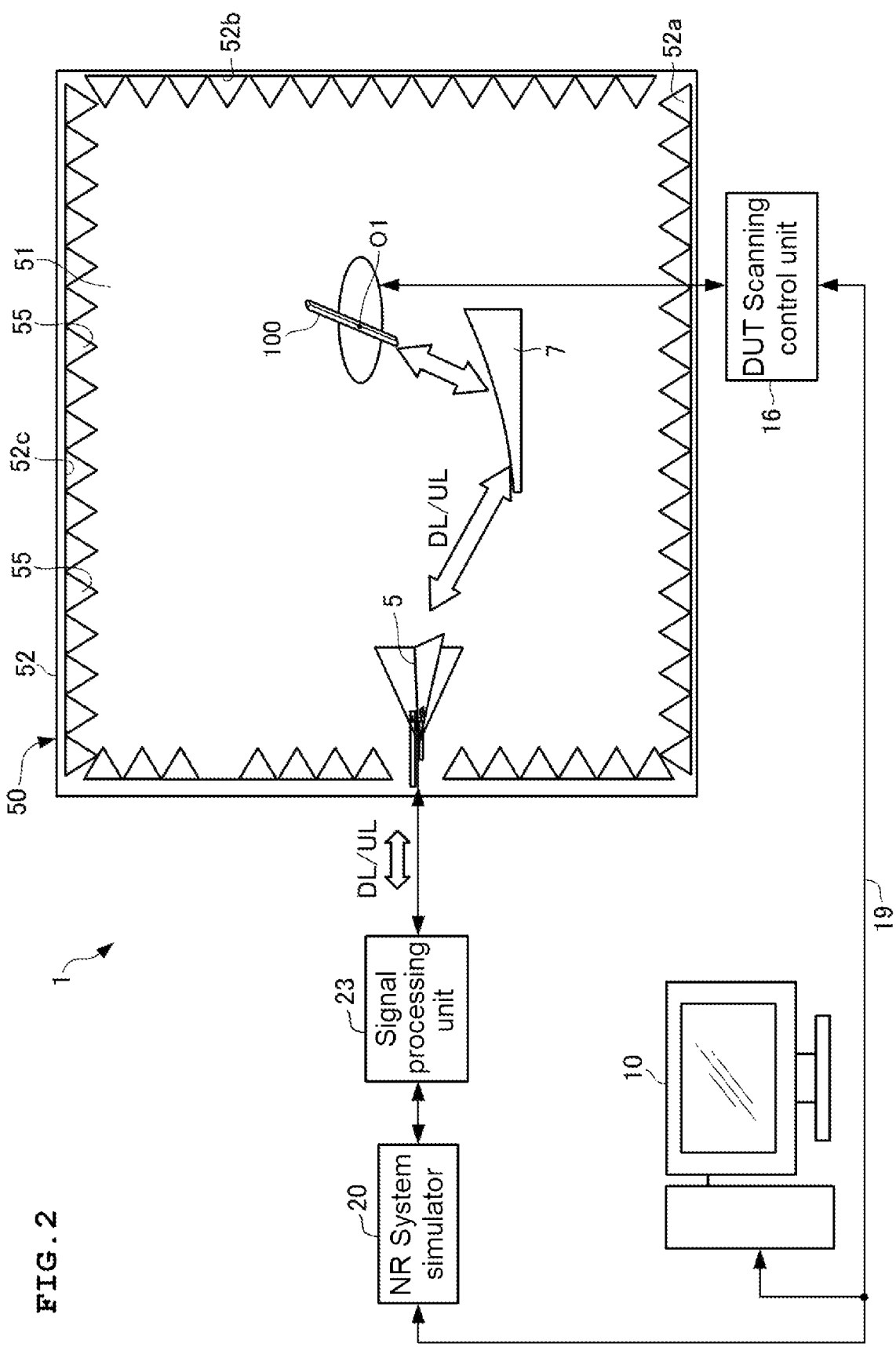
FIG. 2 is a block diagram showing a functional configuration of a measuring device according to the embodiment of the present invention.

First, a configuration of a measuring device 1 according to the embodiment of the present invention will be described with reference to FIGS. 1 to 4. The measuring device 1 constitutes the mobile terminal testing device of the present invention. The measuring device 1 according to the present embodiment has an external structure as shown in FIG. 1 as a whole, and includes functional blocks as shown in FIG. 2. FIGS. 1 and 2 show a disposition mode of each component of an OTA chamber 50 in a state of being seen through from a side surface thereof.

The measuring device 1 is operated, for example, in a mode in which each of the above-described components is mounted on each rack 90*a* of a rack structure 90 having the structure shown in FIG. 1. FIG. 1 shows an example in which each of an integrated control device 10, an NR system simulator 20, and an OTA chamber 50 is mounted on each rack 90*a* of the rack structure 90.

As shown in FIG. 2, the measuring device 1 includes the integrated control device 10, the NR system simulator 20, a signal processing unit 23, and the OTA chamber 50.

For the configuration, the OTA chamber 50 will be described first. As shown in FIGS. 1 and 2, the OTA chamber 50 includes, for example, a metal housing main body 52 having a rectangular internal space 51, and accommodates a DUT 100 having an antenna 110, a test antenna 5, a reflector 7, and a DUT scanning mechanism 56 in the internal space 51.

A radio wave absorber 55 is attached to a whole area of an inner surface of the OTA chamber 50, that is, a bottom surface 52*a*, a side surface 52*b*, and a top surface 52*c* of the housing main body 52. As a result, in the OTA chamber 50, each element (the DUT 100, the test antenna 5, the reflector 7, and the DUT scanning mechanism 56) disposed in the internal space 51 has an enhanced function of regulating intrusion of radio waves from the outside and radiation of the radio waves to the outside. In this way, the OTA chamber 50 realizes a radio anechoic box having the internal space 51 that is not affected by a surrounding radio wave environment. The radio anechoic box used in the present embodiment is, for example, an Anechoic type.

Among those housed in the internal space 51 of the OTA chamber 50, the DUT 100 is, for example, a wireless terminal such as a smartphone. Communication standards for the DUT 100 include cellular (LTE, LTE-A, W-CDMA (registered trademark), GSM (registered trademark), CDMA 2000, 1×EV-DO, TD-SCDMA, or the like), wireless LAN (IEEE 802.11b/g/a/n/ac/ad, or the like), Bluetooth (registered trademark), GNSS (GPS, Galileo, GLONASS, BeiDou, or the like), FM, and digital broadcasting (DVB-H, ISDB-T, or the like). Further, the DUT 100 may be a wireless terminal that transmits and receives a radio signal in a millimeter wave band corresponding to IEEE 802.11ad, 5G cellular, or the like.

In the present embodiment, the antenna 110 of the DUT 100 uses a radio signal in each regulated frequency band in conformity with, for example, LTE or 5G NR communication standard. The DUT 100 constitutes the device under test, that is, a mobile terminal in the present invention.

In the internal space 51 of the OTA chamber 50, the DUT 100 is held by a part of mechanism of the DUT scanning mechanism 56. The DUT scanning mechanism 56 is provided to extend in a vertical direction on the bottom surface 52a of the housing main body 52 in the internal space 51 of the OTA chamber 50. The DUT scanning mechanism 56 performs a total spherical scanning (refer to FIGS. 5 to 6), which will be described later, on the DUT 100 while holding the DUT 100 on which a performance test is performed.

As shown in FIG. 1, the DUT scanning mechanism 56 includes a turntable 56a, a support column member 56b, a DUT mounting portion 56c, and a drive unit 56e. The turntable 56a includes a plate member having a disk shape, and has a configuration (refer to FIGS. 3 and 7) that rotates around an azimuth axis (a rotation axis in the vertical direction). The support column member 56b includes a columnar member disposed to extend in a direction perpendicular to a plate surface of the turntable 56a.

The DUT mounting portion 56c is disposed near an upper end of the support column member 56b to be in parallel with the turntable 56a, and has a mounting tray 56d on which the DUT 100 is mounted. The DUT mounting portion 56c has a configuration (refer to FIGS. 3 and 7) capable of rotating around the roll axis (a rotation axis in a horizontal direction).

Figure 3:
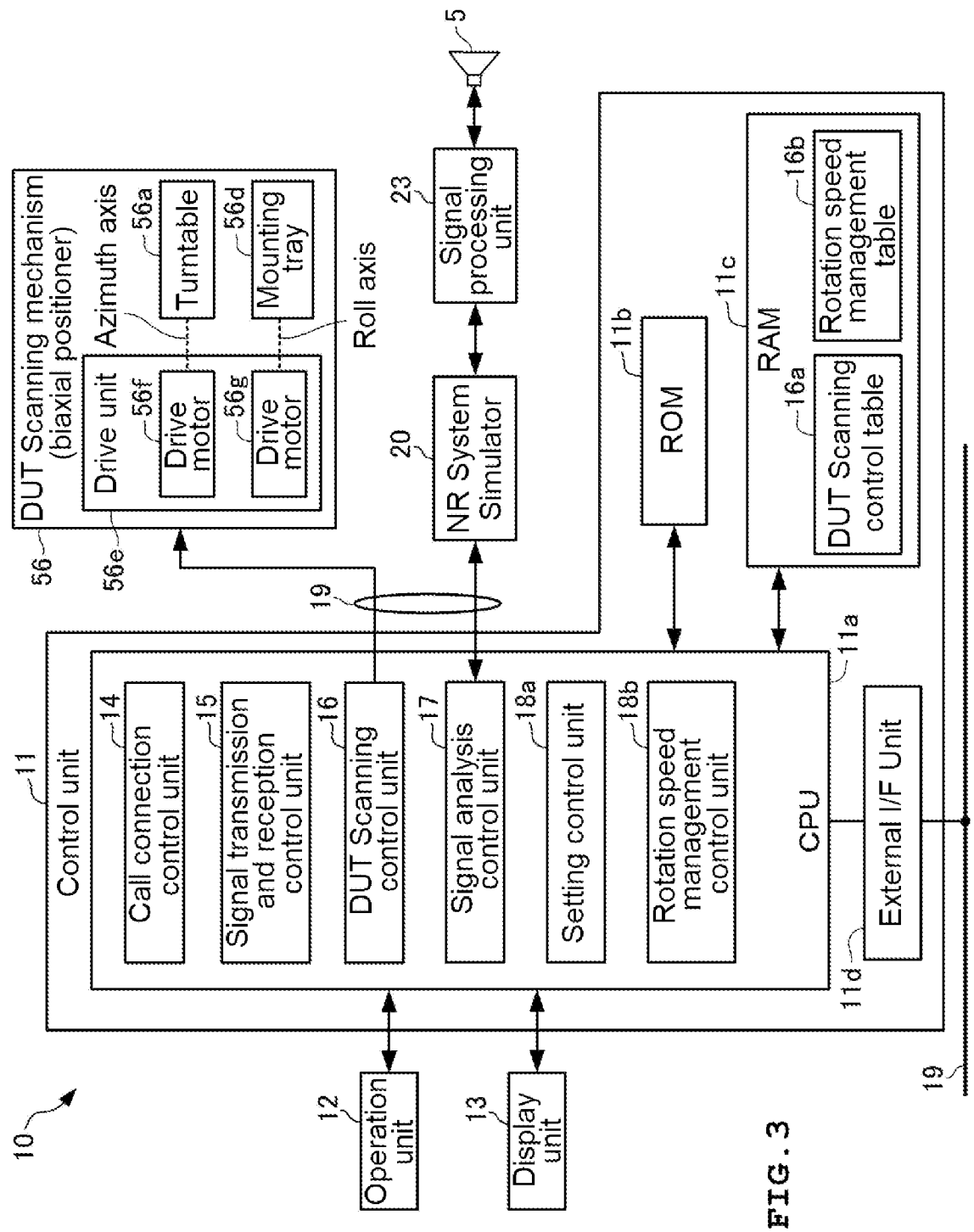
FIG. 3 is a block diagram showing functional configurations of an integrated control device of the measuring device according to the embodiment of the present invention and a controlled element thereof.

As shown in FIG. 3, the drive unit 56e includes, for example, a drive motor 56f that rotationally drives the azimuth axis, and a drive motor 56g that rotationally drives the roll axis. The drive unit 56e includes a biaxial positioner provided with a mechanism for rotating the azimuth axis and the roll axis around respective shaft centers thereof by the drive motor 56f and the drive motor 56g. In this way, the drive unit 56e can rotate the DUT 100 mounted on the mounting tray 56d in biaxial (the azimuth axis and the roll axis) directions for each mounting tray 56d. Hereinafter, there is a case where the entire DUT scanning mechanism 56 including the drive unit 56e is referred to as the biaxial positioner (refer to FIG. 3). Each of the drive unit 56e and the drive motors 56f and 56g constitutes a first drive motor and a second drive motor in the present invention.

The DUT scanning mechanism (biaxial positioner) 56 performs total spherical scanning which sequentially changes a posture of the DUT 100 in a state in which the antenna 110 faces all directions (a plurality of preset directions) of a surface of the sphere while assuming that the DUT 100 mounted (held) on the mounting tray 56d is disposed, for example, at a center O1 of a sphere (refer to a sphere B in FIG. 5). Control of the DUT scanning in the DUT scanning mechanism 56 is performed by a DUT scanning control unit 16 which will be described later. The DUT scanning mechanism 56 constitutes the positioner in the present invention.

The test antenna 5 is attached to a required position on the bottom surface 52a of the housing main body 52 of the OTA chamber 50 by using an appropriate holder (not shown). An attachment position of the test antenna 5 is a position at which visibility can be secured from the reflector 7 via an opening 67a provided on the bottom surface 52a. The test antenna 5 uses a radio signal in the frequency band of the same regulation (NR standard) as the antenna 110 of the DUT 100.

In a case where measurement related to the NR of the DUT 100 is performed in the OTA chamber 50, the test antenna 5 transmits a test signal from the NR system simulator 20 to the DUT 100 and receives a measured signal transmitted from the DUT 100 that receives the test signal. The test antenna 5 is disposed so that a light reception surface thereof becomes a focal position F of the reflector 7. The reflector 7 is not always required in a case where the test antenna 5 can be disposed so that the light reception surface thereof faces the DUT 100 and appropriate light reception can be performed.

The reflector 7 is attached to a required position on the side surface 52b of the OTA chamber 50 by using a reflector holder 58. The reflector 7 realizes a radio wave path that returns the radio signal (the test signal and the measured signal) transmitted and received by the antenna 110 of the DUT 100 to the light reception surface of the test antenna 5.

Subsequently, configurations of the integrated control device 10 and the NR system simulator 20 will be described.

As shown in FIG. 2, the integrated control device 10 is communicably connected to the NR system simulator 20 via a network 19 such as Ethernet (registered trademark). Further, the integrated control device 10 is also connected to a controlled system element in the OTA chamber 50, for example, the DUT scanning control unit 16 via the network 19.

The integrated control device 10 comprehensively controls the NR system simulator 20 and the DUT scanning control unit 16 via the network 19, and includes, for example, a Personal Computer (PC). The DUT scanning control unit 16 may be independently provided accompanying with the OTA chamber 50 (refer to FIG. 2), or may be provided in the integrated control device 10 as shown in FIG. 3. Hereinafter, description will be performed while assuming that the integrated control device 10 has the configuration shown in FIG. 3. The integrated control device 10 constitutes measurement control means of the present invention.

As shown in FIG. 3, the integrated control device 10 includes a control unit 11, an operation unit 12, and a display unit 13. The control unit 11 includes, for example, a computer device. The computer device includes a Central Processing Unit (CPU) 11a that performs predetermined information processing to realize the function of the measuring device 1, and performs comprehensive control on the NR system simulator 20, and the DUT scanning control unit 16 as targets, a Read Only Memory (ROM) 11b that stores an Operating System (OS) for starting up the CPU 11a, the other programs, and control parameters, and the like, a Random Access Memory (RAM) 11c that stores execution code, data, and the like of the OS or an application which is used for an operation by the CPU 11a, an external I/F unit 11d, an input and output port (not shown), and the like.

The external I/F unit 11d is communicably connected to each of the NR system simulator 20 and the drive unit 56e of the DUT scanning mechanism (biaxial positioner) 56 via the network 19. An operation unit 12 and a display unit 13 are connected to the input and output port. The operation unit 12 is a functional unit for inputting various information such as commands, and the display unit 13 is a functional unit for displaying various information such as an input screen, measurement results, and the like of the various information.

The computer device described above functions as the control unit 11 in such a way that the CPU 11a executes a program stored in the ROM 11b while using the RAM 11c as a work area. As shown in FIG. 3, the control unit 11 includes a call connection control unit 14, a signal transmission and reception control unit 15, a DUT scanning control unit 16, a signal analysis control unit 17, a setting control unit 18a, and a rotation speed management control unit 18b. The call connection control unit 14, the signal transmission and reception control unit 15, the DUT scanning control unit 16, the signal analysis control unit 17, the setting control unit 18a, and the rotation speed management control unit 18b are also realized by executing a predetermined program stored in the ROM 11b in the work area of the RAM 11c by the CPU 11a.

The call connection control unit 14 drives the test antenna 5 via the NR system simulator 20 and the signal processing unit 23 to transmit and receive a control signal (radio signal) to and from the DUT 100, thereby performing control to establish a call (a state in which the radio signal can be transmitted and received) between the NR system simulator 20 and the DUT 100.

The signal transmission and reception control unit 15 performs a control of monitoring an user operation in the operation unit 12, transmitting a signal transmission command to the NR system simulator 20 after the call is established through call connection control, by being triggered with predetermined measurement start operation related to the measurement of transmission and reception characteristics of the DUT 100, and transmitting the test signal from the NR system simulator 20 via the test antenna 5, and a control of transmitting a signal reception command and receiving the measured signal via the test antenna 5.

The DUT scanning control unit 16 drives and controls the drive motors 56f and 56g of the DUT scanning mechanism to perform total spherical scanning of the DUT 100 mounted on the mounting tray 56d of the DUT mounting portion 56c.

Here, the total spherical scanning of the DUT 100 will be described with reference to FIGS. 5 to 7. Generally, related to measurement of power of a signal radiated by the DUT 100 (radiated power measurement), a method for measuring an Equivalent Isotropic Radiated Power (EIRP) and a method for measuring Total Radiated Power (TRP) are known. The EIRP is, for example, a power value measured at each measurement point (θ, φ) in the spherical coordinate system (γ, θ, φ) shown in FIG. 5A. On the other hand, the TRP is obtained by measuring the EIRP in all directions of the spherical coordinate system (γ, θ, φ), that is, a plurality of angular sample points PS (refer to FIG. 5B), which are regulated in advance, on a spherical surface at an equidistant distance from the center O1 (hereinafter, a reference point) of the total spherical scanning of the DUT 100, and obtaining a total sum thereof.

The total spherical scanning of the DUT 100 means a control operation of sequentially changing the DUT 100 mounted on the mounting tray 56d in all directions of a surface of a sphere B while using, for example, a center of the sphere B (refer to FIG. 5) as a reference (center), that is, sequentially changing a posture of the DUT 100 in a state in which the antenna 110 faces the angular sample point PS.

Figure 6:
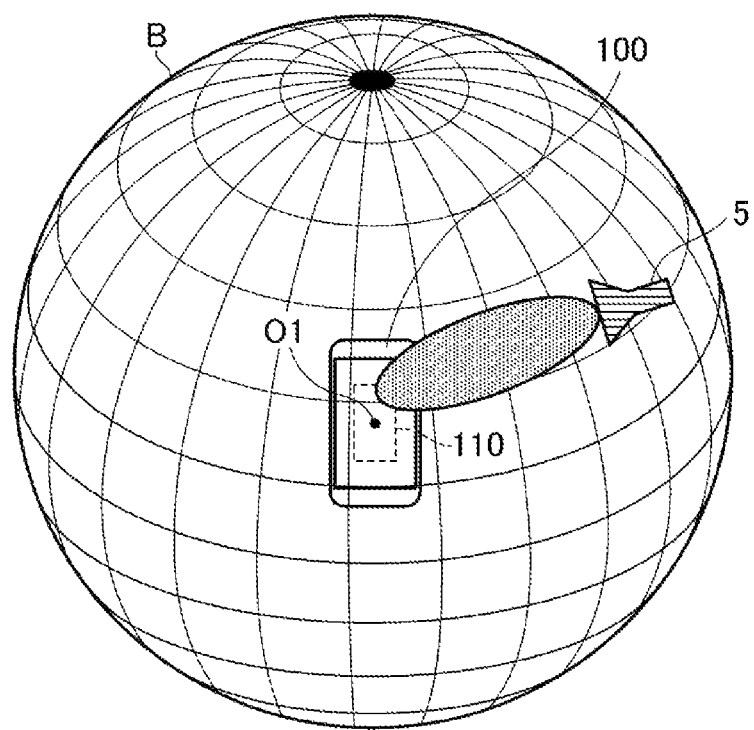
FIG. 6 is a diagram explaining a disposition mode of a test antenna 5 in the OTA chamber of the measuring device according to the embodiment of the present invention using the spherical coordinate system (γ, θ, φ) shown in FIG. 5.

Since the EIRP is measured at each angular sample point PS in accordance with the total spherical scanning of the DUT 100, at a position of a specific angular sample point PS (1 point) in the spherical coordinate system (γ, θ, φ) as shown in FIG. 6, the test antenna 5 for receiving the signal radiated by the DUT 100 is disposed as shown in FIG. 6.

In the total spherical scanning, the DUT 100 is driven (scanned) so that an antenna surface of the antenna 110 sequentially faces the light reception surface of the test antenna 5. As a result, the test antenna 5 can transmit and receive a signal for TRP measurement to and from the antenna 110 of the DUT 100 on which the total spherical scanning is performed. Here, the transmitted and received signal includes a test signal that is transmitted from the NR system simulator 20 via the test antenna 5, and a signal that is transmitted by the DUT 100, which receives the test signal, using the antenna 110, that is, a measured signal that is received via the test antenna 5.

The total spherical scanning of the DUT 100 is realized by rotationally driving the azimuth axis and the roll axis by the drive motors 56f and 56g which constitutes the DUT scanning mechanism 56. FIG. 7 shows a rotation drive image around the azimuth axis and the roll axis of the DUT scanning mechanism (biaxial positioner) 56 related to the total spherical scanning of the DUT 100 in the measuring device 1. As shown in FIG. 7, in the DUT scanning mechanism 56 of the measuring device 1 according to the present embodiment, the azimuth axis is moved in an angular direction of φ around the axis thereof, for example, within a range of 180 degrees and the roll axis is moved in an angular direction of θ around the axis thereof, for example, within a range of 360 degrees, so that it is possible to perform the total spherical scanning (refer to FIGS. 5 and 6) in which the DUT 100 is rotated in all directions based on the center O1 thereof.

Figure 7:
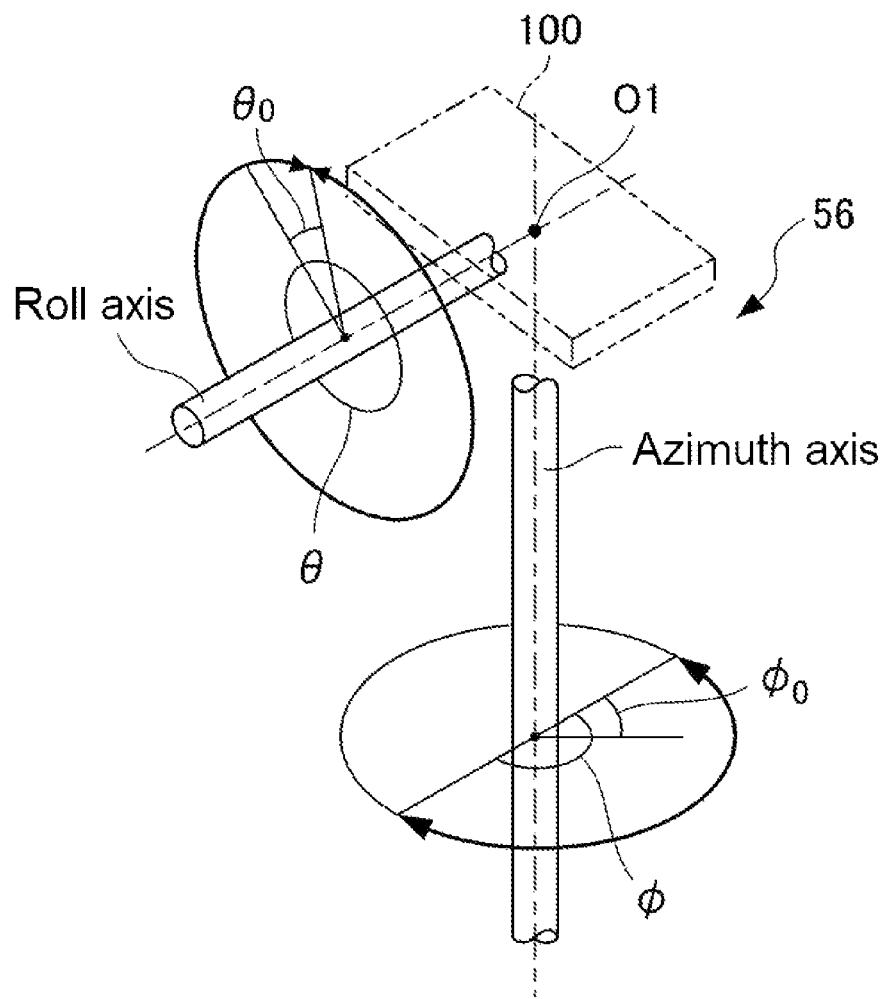
FIG. 7 is a diagram showing a rotation drive image around an azimuth axis and a roll axis of a biaxial positioner related to the total spherical scanning of the DUT in the measuring device according to the embodiment of the present invention.

In FIG. 7, $\varphi_0$ indicates a unit movement angle in a total movement angle (180 degrees) in the rotation direction (angular direction of φ) of the azimuth axis, and $\theta_0$ indicates the unit movement angle (hereinafter, step angle) in the total movement angle (360 degrees) in the rotation direction (angular direction of el) of the roll axis. For $\varphi_0$ and $\theta_0$, for example, a step angle of a desired value can be selectively set from a plurality of step angles of different values which are regulated in advance. The set $\varphi_0$ and $\theta_0$ regulate an angle between the adjacent angular sample points PS shown in FIG. 5B, and, as a result, regulates the angular sample point PS, that is, the number of measurement positions.

In order to realize control of the total spherical scanning of the DUT 100 by the DUT scanning control unit 16, for example, a DUT scanning control table 16a is prepared in the ROM 11b in advance. The DUT scanning control table 16a stores, for example, coordinates of each angular sample point PS (refer to FIG. 5B) in the spherical coordinate system (refer to FIG. 5A) related to the total spherical scanning of the DUT 100, drive data of the drive motors 56f and 56g associated with the coordinates of each angular sample point PS, and control data associated with a stop time (measurement time) at each angular sample point PS. In a case where the drive motors 56f and 56g are, for example, stepping motors, for example, the number of drive pulses is stored as the drive data.

Figures 8, 9:
FIG. 8 is a table diagram showing a data configuration example of a rotation speed management table provided in a RAM of the integrated control device of the measuring device according to the embodiment of the present invention.
FIG. 9 is a diagram showing a relationship between a total time required for the biaxial positioner to move at all unit step angles, the biaxial positioner being included in the measuring device according to the embodiment of the present invention, and a rotation speed of a drive motor in a data format.

The ROM 11b is further prepared with a rotation speed management table 16b for managing rotation speeds of the drive motor 56f and the drive motor 56g of the DUT scanning mechanism 56. A configuration example of the rotation speed management table 16b is shown in FIG. 8. The rotation speed management table 16b manages the rotation speed of the drive motor 56g that rotationally drives the roll axis, and, more specifically, the rotation speed of the drive motor 56g in a case where the DUT scanning mechanism 56 is rotationally driven for each step angle.

Figure 5A:
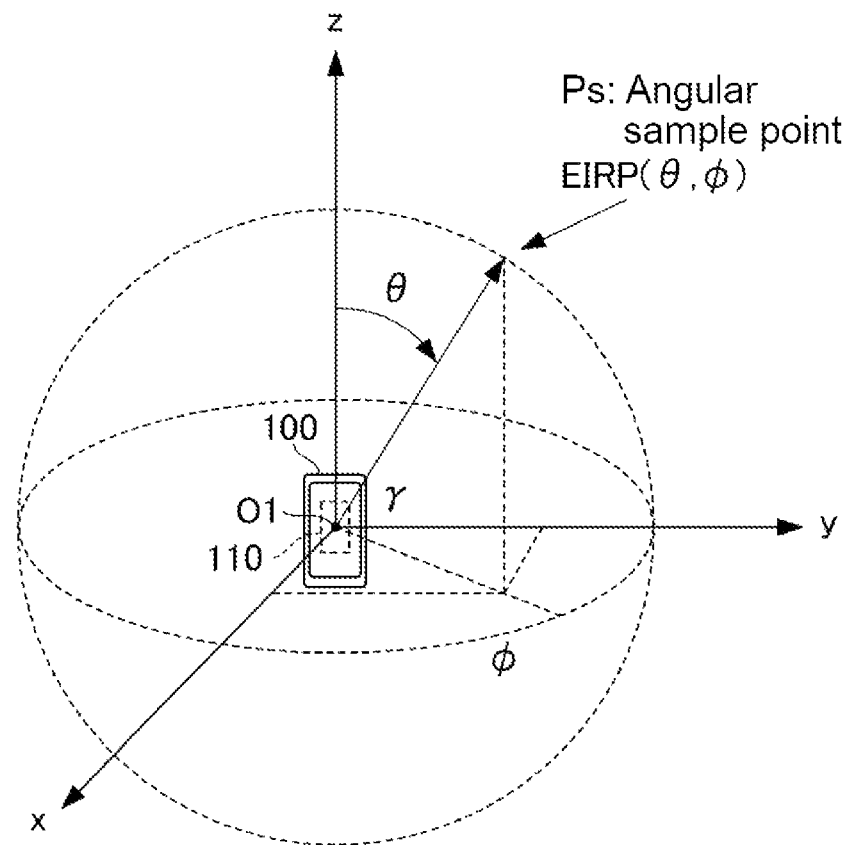
Figure 5B:
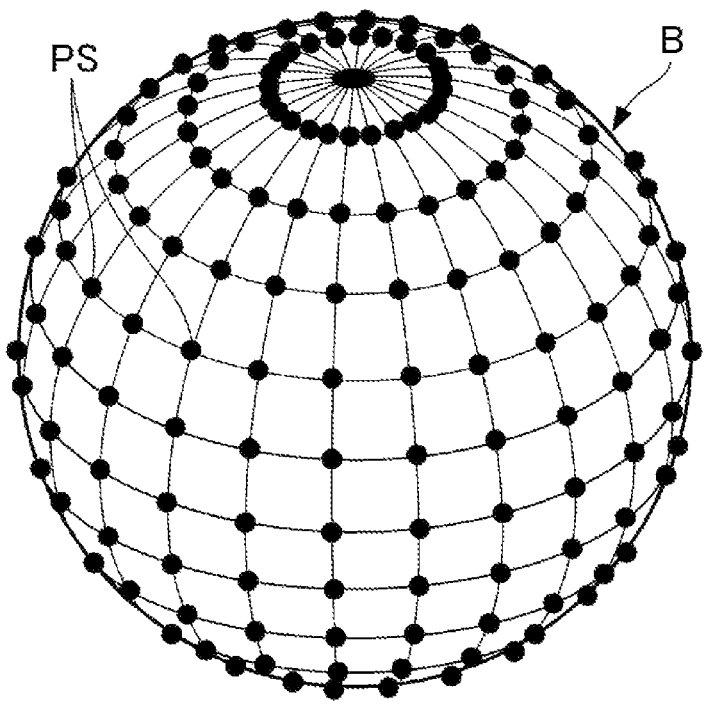

Here, in a case where description is performed with reference to FIG. 5, the step angle indicates an angle between adjacent angular sample points PS (refer to FIG. 5B) in the spherical coordinate system (refer to FIG. 5A) related to the total spherical scanning. The angular sample point PS corresponds to the measurement position of the DUT 100, and the number thereof can be appropriately set to be variable according to a measurement item, a measurement condition, and the like. That is, the unit step angle is obtained by regulating an angle between adjacent measurement positions and may be variable according to the measurement item, the measurement condition, and the like. For the DUT scanning mechanism 56 according to the present embodiment, it is possible to selectively set for example, a value of 5 degrees (deg), degrees, 15 degrees, 30 degrees, 90 degrees, 180 degrees, and 360 degrees for the step angle $\theta$ (refer to FIG. 7) of the roll axis by the drive motor 56g.

In the rotation speed management table 16b shown in FIG. 8, each of the values of 5 degrees, 10 degrees, 15 degrees, and 30 degrees is set with regard to the step angle (corresponding to $\theta_0$ in FIG. 7) of the roll axis, and the rotation speed (unit is rpm) each having values of 3, 4, 4, and 7 is stored to correspond to each of the step angles. In a case where the DUT scanning mechanism 56 is moved around the roll axis at each corresponding step angle, the rotation speed (set value) becomes the rotation speed of the drive motor 56g, which is optimal to minimize a time required for the DUT scanning mechanism 56 to move at the step angle, and each has a value which is smaller than the maximum rotation speed of the drive motor 56g (15 rpm in the table of FIG. 9).

FIG. 8 shows an example of the rotation speed management table 16b for managing the rotation speed of the drive motor 56g which can minimize the movement time in each step section of the DUT scanning mechanism 56 corresponding to each step angle $\theta$ (for example, 5 degrees, 10 degrees, 15 degrees, or 30 degrees) of the roll axis.

The present embodiment is not limited thereto, in the present invention, instead of the rotation speed management table 16b (first rotation speed management table), a second rotation speed management table may be provided which manages a rotation speed of the drive motor 56f, which can minimize the movement time of the DUT scanning mechanism 56 in each step section to correspond to each step angle (corresponding to $\varphi$ in FIG. 7) of the azimuth axis, for example, 5 degrees, 10 degrees, 15 degrees, or 30 degrees.

Further, in the present invention, instead of the first rotation speed management table and the second rotation speed management table, a second rotation speed management table may be provided which manages the rotation speed of the drive motor 56g and the drive motor 56f, which can minimize the movement time of the DUT scanning mechanism 56 in each step section to correspond to each step angle $\theta$ of the roll axis and each step angle $\varphi$ of the azimuth axis.

The DUT scanning control unit 16 expands the DUT scanning control table 16a into the work area of the RAM 11c, and drives and controls the drive motors 56f and 56g of the DUT scanning mechanism 56 based on the control data stored in the DUT scanning control table 16a. As a result, the total spherical scanning of the DUT 100 mounted on the DUT mounting portion 56c is performed. In the total spherical scanning, the antenna surface of the antenna 110 of the DUT 100 is stopped for a regulated time (the stop time) toward the angular sample point PS for each angular sample point PS in the spherical coordinate system, and, thereafter, an operation of moving to a next angular sample point PS (scanning of the DUT 100) is sequentially performed while targeting all the angular sample points PS.

Further, the DUT scanning control unit 16 performs rotation speed control on the drive motor 56g related to the movement of the DUT scanning mechanism 56 targeting each step angle $\theta$ of the roll axis using the rotation speed management table 16b under the control of the rotation speed management control unit 18b, which will be described later, in accordance with the total spherical scanning of the DUT scanning mechanism 56 using the DUT scanning control table 16a. According to a data configuration example of the rotation speed management table 16b shown in FIG. 8, in a case where, for example, 5 degrees, 10 degrees, 15 degrees, and 30 degrees are set as the step angle $\theta$, control is performed so that the drive motor 56g has each of the rotation speeds (unit is rpm) of 3, 4, 4, and 7, in a case where the DUT scanning mechanism is moved at the step angles $\theta$. The rotation speed control will be described in detail later with reference to FIG. 12.

The signal analysis control unit 17 captures a radio signal, which is related to the NR and is received by the test antenna 5 in a case where the total spherical scanning of the DUT 100 is performed, via the NR system simulator 20, and performs an analysis process (measurement process) on the radio signal as a signal of a specific measurement item.

The setting control unit 18a is a functional unit for setting various information necessary to execute the rotation speed control of the drive motor 56f using the rotation speed management table 16b by the DUT scanning control unit 16. In a case where the specific measurement item is measured, the setting control unit 18a can selectively set a step angle of a desired value from among step angles ($\theta$, $\varphi$) having a plurality of different values, for example, 5 degrees, 10 degrees, 15 degrees, and 30 degrees. The setting control unit 18a constitutes setting means of the present invention.

For example, the rotation speed management control unit 18b performs the rotation speed control of the drive motor 56f related to the movement of the DUT scanning mechanism 56 targeting each step angle $\theta$ of the roll axis in cooperation with the DUT scanning control unit 16 using the rotation speed management table 16b in accordance with the total spherical scanning of the DUT scanning mechanism 56 in a case where the TRP measurement is performed. The rotation speed management control unit 18b constitutes rotation speed control means of the present invention.

Figure 4:
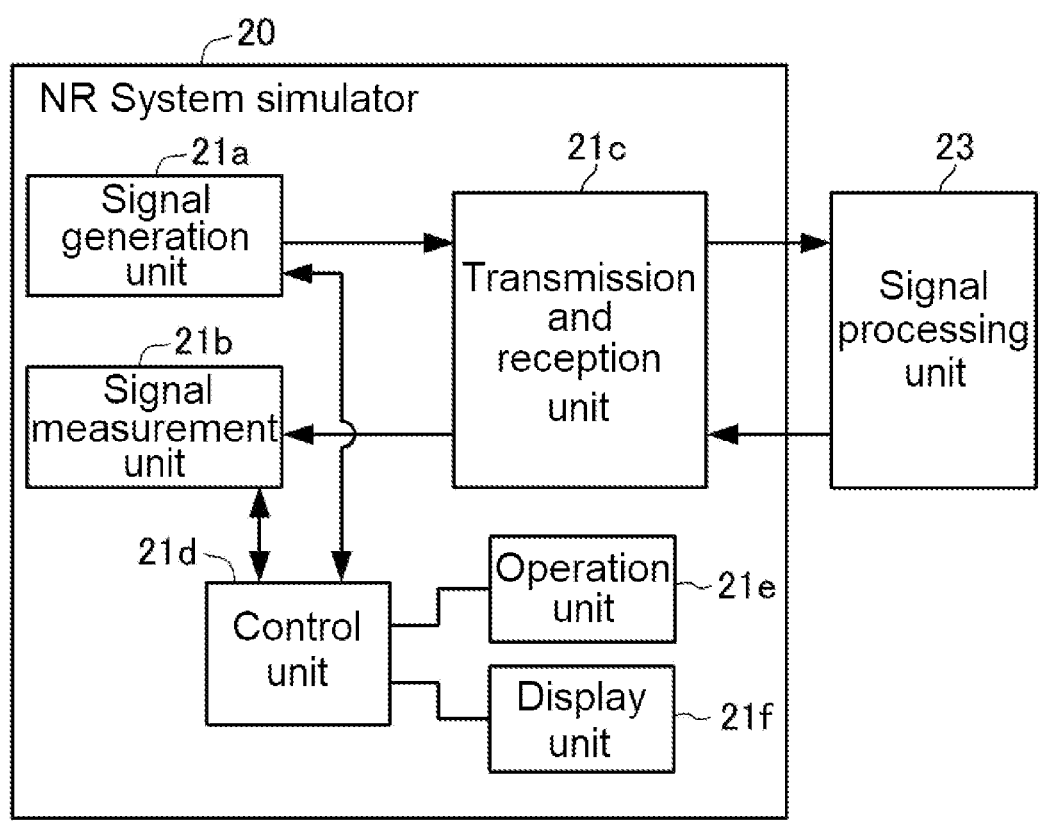
FIG. 4 is a block diagram showing a functional configuration of an NR system simulator in the measuring device according to the embodiment of the present invention.

As shown in FIG. 4, the NR system simulator 20 includes a signal generation unit 21a, a signal measurement unit 21b, a transmission and reception unit 21c, a control unit 21d, an operation unit 21e, and a display unit 22f. The NR system simulator 20 constitutes a simulated measuring device of the present invention.

The signal generation unit 21a generates a signal (baseband signal) that becomes a source of the test signal. The transmission and reception unit 21c functions as an RF unit that generates the test signal corresponding to a frequency of each communication standard from the signal generated by the signal generation unit 21a and sends the generated test signal to the signal processing unit 23, and restores the baseband signal from the measured signal which is sent from the signal processing unit 23. The signal measurement unit 21b performs the measurement process of the measured signal based on the baseband signal restored by the transmission and reception unit 21c.

The control unit 21d comprehensively controls each of the functional units including the signal generation unit 21a, the signal measurement unit 21b, the transmission and reception unit 21c, the operation unit 21e, and the display unit 22f. The operation unit 21e is a functional unit for inputting various information such as commands, and the display unit 22f is a functional unit for displaying various information such as an input screen of the various information and measurement results.

In the measuring device 1 having the above-described configuration, the DUT 100 is mounted on the mounting tray 56d of the DUT scanning mechanism (biaxial positioner) 56 in the internal space 51 of the OTA chamber 50. Therefore, it is possible to perform measurement of the specific measurement item, such as measurement of the EIRP at each measurement position and measurement of the TRP over all measurement positions, while moving (rotating) the DUT 100 by a preset step angle in the biaxial (azimuth axis and roll axis) direction for each mounting tray 56d.

Subsequently, measurement control of the DUT 100 by the integrated control device 10 of the measuring device 1 according to the present embodiment will be described. The measuring device 1 performs the measurement control of the specific item (TRP or the like) of the DUT 100 along a flowchart shown in FIG. 11 by applying the mobile terminal testing method of the present invention.

In order to perform the measurement of the specific item in the measuring device 1, first, the DUT 100 to be tested is set in the DUT mounting portion 56c of the DUT scanning mechanism (biaxial positioner) 56 of the OTA chamber 50, and then a measurement parameter is set by the operation unit 12 (step S1). Here, the measurement item is an example of the parameter to be set. In a case where a setting item is a radiated power characteristic, such as TRP, that requires the total spherical scanning, it is necessary to further set the step angle.

After setting of the measurement parameter is completed, the integrated control device 10 monitors whether or not the measurement start operation is performed in the operation unit 12 (step S2). Here, in a case where the measurement start operation is performed (YES in step S2), in the control unit 11 of the integrated control device 10, the DUT scanning control unit 16 rotationally drives the drive motors 56f and 56g so that the biaxial positioner is rotated (moved) up to an angular position of (θ, φ) corresponding to an initial measurement position in the spherical coordinate system (γ, θ, φ) shown in FIG. 5A according to the measurement parameter (for example, step angle) set in step S1 (step S3).

Subsequently, the control unit 11 drives and controls the NR system simulator 20, and controls to perform the measurement of the measurement item (EIRP at the measurement position in a case of the TRP measurement) which is preset (designated) at the measurement position (the initial measurement corresponds to the initial measurement position) corresponding to the angular position of the biaxial positioner in step S3 (step S4).

In a case where the measurement process is performed in step S4, it is premised that call connection is made in advance between the NR system simulator 20 and the DUT 100 under the control of the call connection control unit 14. In a call connection state, the signal transmission and reception control unit 15 causes the test signal to be transmitted from the NR system simulator 20, and the signal analysis control unit 17 receives the measured signal which is transmitted by the DUT 100 as a response in response to the reception of the test signal, and performs the analysis process (measurement process) of the designated measurement item.

In a case where the measurement of the designated measurement item is completed at a current measurement position in step S4, the DUT scanning control unit 16 next determines whether or not a remaining measurement position exists (step S5).

In a case where it is determined that the remaining measurement position exists (YES in step S5), the DUT scanning control unit 16 rotationally drives the drive motors 56f and 56g so that the biaxial positioner moves to the angular position of (θ, φ) corresponding to a next measurement position in the spherical coordinate system (γ, θ, φ) (step S3). Here, the angle at which the biaxial positioner is moved (angle from a previous measurement position to the next measurement position) corresponds to the step angle at which setting is received in step S1.

Figure 12:
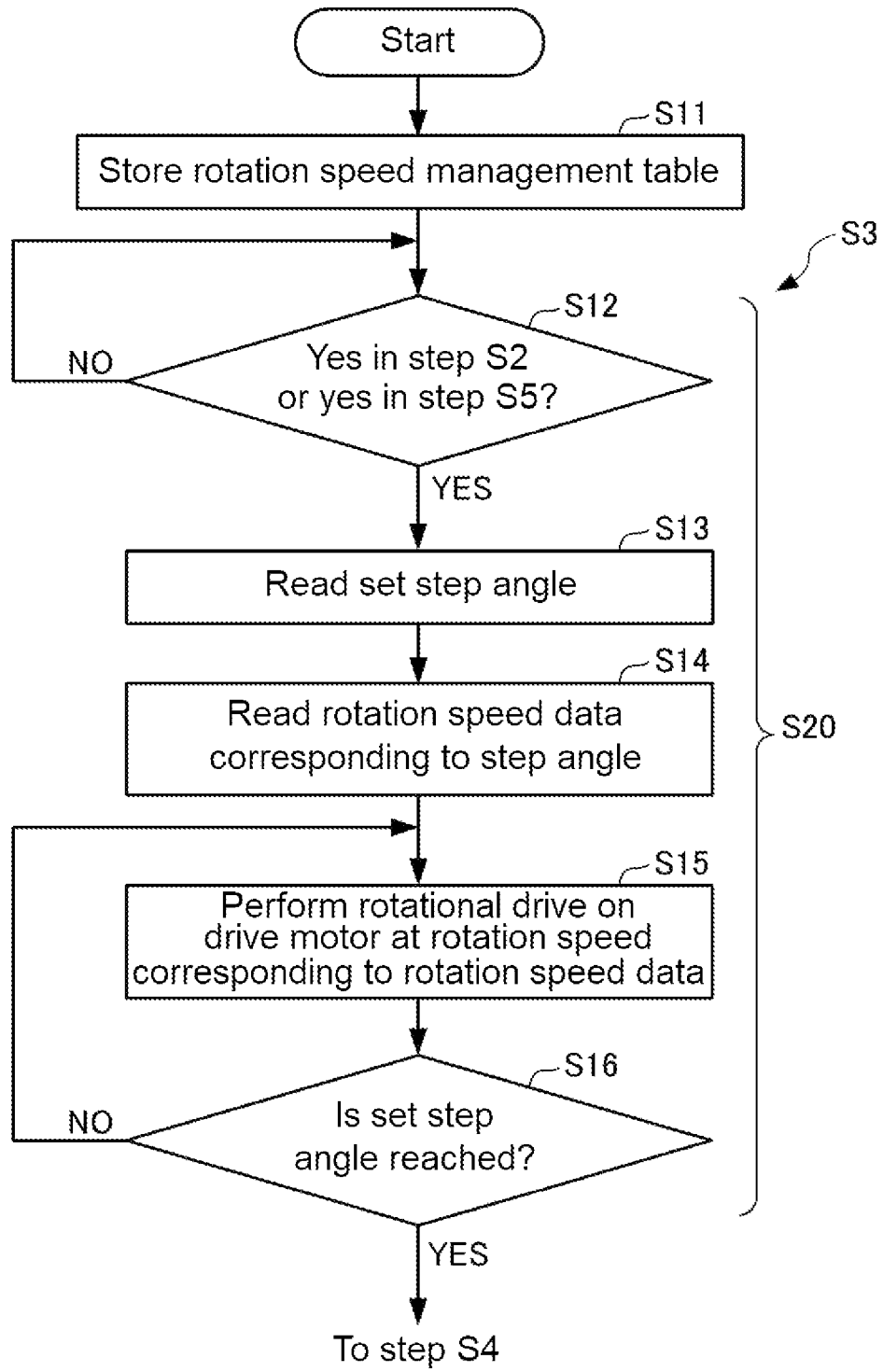
FIG. 12 is a flowchart showing a rotation speed control operation of the drive motor in a case where the biaxial positioner is moved at the unit step angle by the integrated control device of the measuring device according to the embodiment of the present invention.

In accordance with the movement of the biaxial positioner at the step angle in step S3, the rotation speed management control unit 18b performs control to rotationally drive the drive motors 56f and 56g at the rotation speed stored in the rotation speed management table 16b to correspond to the step angle set in step S1 (refer to FIG. 12).

In a case where the movement of the biaxial positioner at the step angle is completed and the biaxial positioner stops at the next measurement position, the control unit 11 drives and controls the NR system simulator 20 and performs control so that the measurement of the designated measurement item is performed at the next (second) measurement position corresponding to the angular position of the biaxial positioner in step S3 (step S4).

After that, while it is determined that the remaining measurement positions exist in step S5 (YES in step S5), the DUT scanning control unit 16 and the signal analysis control unit 17 repeatedly perform control to rotate the biaxial positioner up to an angular position of (θ, φ) corresponding to the next measurement position at the step angle in step S3 and to measure the designated measurement item at the measurement position in step S4 while updating the measurement position. In every movement of the biaxial positioner at the step angle, the rotation speed management control unit 18b performs control to rotationally drive the drive motors 56f and 56g at the rotation speed stored in the rotation speed management table 16b to correspond to the step angle set in step S1.

In a case where it is determined that the remaining measurement position does not exist in step S5 (NO in step S5) while updating the measurement position and repeating the measurement, the signal analysis control unit 17 aggregates measurement results (measurement data: EIRP in TRP measurement) of respective measurement positions from the initial measurement position up to a last measurement position in step S4, obtains a total sum thereof and holds the total sum as the measurement result of the designated measurement item, and then ends a series of measurement control operations.

Next, the rotation speed control operation of the drive motors 56f and 56g in a case where the biaxial positioner 56 is moved at the unit step angle by the integrated control device 10 of the measuring device 1 according to the present embodiment will be described with reference to a flowchart shown in FIG. 12. In FIG. 12, in particular, a case where the drive motor 56g is driven will be described.

In order to perform the rotation speed control, it is necessary to prepare the rotation speed management table 16b (refer to FIG. 8) in advance (step S11). As shown in FIG. 8, the rotation speed management table 16b stores the rotation speed of the drive motor 56g, which can minimize the movement time of the biaxial positioner at each step angle so as to correspond to each of the step angles (5 degrees, 10 degrees, 15 degrees, and 30 degrees) which can be set in step S1 of FIG. 11.

In order to generate the rotation speed management table 16b, it is necessary to perform a pseudo measurement operation of, after setting a certain step angle and the rotation speed of the drive motor 56g by simulating actual measurement, sequentially moving the biaxial positioner from the initial measurement position up to the last measurement position while rotationally driving the drive motor 56g at the rotation speed set between respective measurement positions, and to perform an operation of measuring a total time taken for the pseudo measurement operation. It is preferable that the pseudo measurement operation is performed a plurality of times by changing the rotation speed of the drive motor 56g for each step angle.

Figure 10:
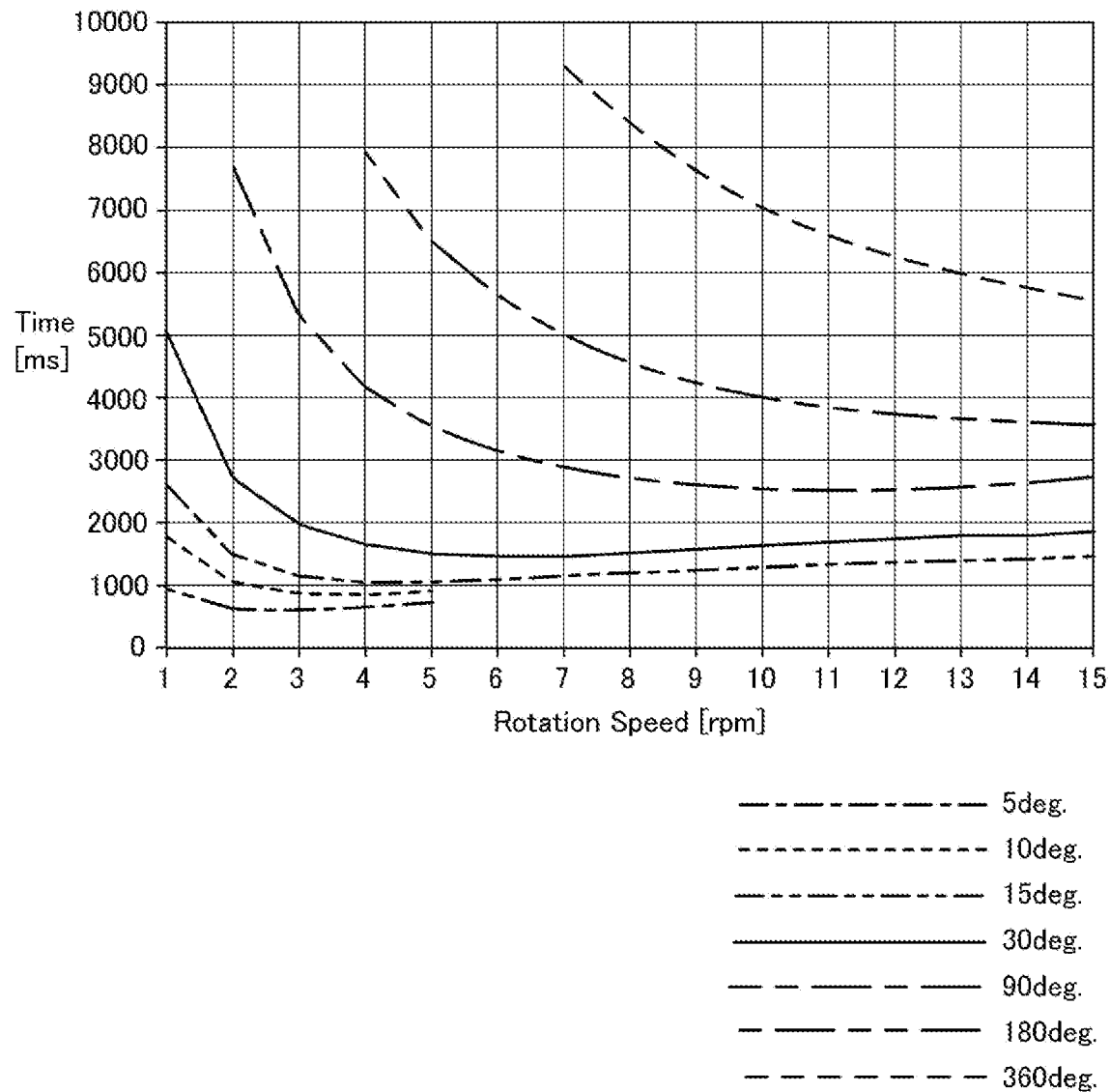
FIG. 10 is a diagram showing the relationship between the total time required for the biaxial positioner to move at all unit step angles, the biaxial positioner being included in the measuring device according to the embodiment of the present invention, and the rotation speed of the drive motor as a graph.

FIG. 9 shows a relationship between a time required for the biaxial positioner of the measuring device 1 to move at each unit step angle and the rotation speed of the drive motor 56g in a data format, the relationship being obtained from the measurement result in the above work, and FIG. 10 shows the relationship as a graph.

According to the relationship between the time required for the biaxial positioner to move at each unit step angle and the rotation speed of the drive motor 56g shown in FIGS. 9 and 10, 47.83, 32.88, 31.71, 34.30, and 36.34 are obtained for a total movement time (unit: minutes) of the biaxial positioner, which is taken in a case where the step angle is set to 5 degrees and the rotation speed of the drive motor 56g is changed to 1, 2, 3, 4, and 5.

Further, 23.32, 14.17, 12.35, 11.92, and 12.65 are obtained as the total movement time (unit: minutes) of the biaxial positioner, which is taken in a case where the step angle is set to 10 degrees and the rotation speed of the drive motor 56g is changed to 1, 2, 3, 4, and 5.

Further, 15.89, 9.44, 7.67, 6.91, 6.92, 7.33, 7.63, 7.91, 8.16, 8.22, 8.59, 8.79, 8.98, 9.13, and 9.30 are obtained as the total movement time (unit: minutes (min)) of the biaxial positioner, which is taken in a case where the step angle is set to 15 degrees and the rotation speed of the drive motor 56g is changed to 1, 2, 3, 4, 5, 6, 7, 8, 9, 10, 11, 12, 13, 14, and 15.

Further, 8.68, 4.91, 3.77, 3.28, 3.01, 2.94, 2.93, 3.02, 3.12, 3.21, 3.28, 3.35, 3.39, 3.50, and 3.56 are obtained as the total movement time (unit: minutes) of the biaxial positioner, which is taken in a case where the step angle is set to 30 degrees and the rotation speed of the drive motor 56g is changed to 1, 2, 3, 4, 5, 6, 7, 8, 9, 10, 11, 12, 13, 14, and 15.

In order to minimize (optimize) the total movement time of the biaxial positioner from an aggregation result of the total movement time of the biaxial positioner related to the pseudo measurement operation shown in FIGS. 9 and 10, it is understood that the rotation speed of the drive motor 56g may be set to 3 in a case where the step angle is set to 5 degrees.

Similarly, in order to minimize the total movement time of the biaxial positioner in a case where the step angle is set to 10 degrees, 15 degrees, and 30 degrees, it is understood that the rotation speed of the drive motor 56g may be set to 4, 4, and 7, respectively.

The rotation speed management table 16b shown in FIG. 8 is generated based on the aggregation result of the total movement time of the biaxial positioner related to the pseudo measurement operation shown in FIGS. 9 and 10, and stores 3, 4, 4, and 7 as an optimal value of the rotation speed (unit: rpm) of the drive motor 56g so as to correspond to each of the step angles of 5 degrees, 10 degrees, 15 degrees, and 30 degrees. All the values are set to a value which is smaller than the maximum rotation speed (15 rpm: refer to FIG. 9) of the drive motor 56g.

In the measuring device 1 according to the present embodiment, in step S11, the rotation speed management table 16b having the data structure is stored in, for example, the RAM 11c. In this state, the rotation speed management control unit 18b of the integrated control device 10 can perform the rotation speed control (step S20) of the drive motor 56g in steps subsequent to step S12 shown in FIG. 12 in accordance with the movement control of the biaxial positioner in step S3 of FIG. 11.

Figure 11:
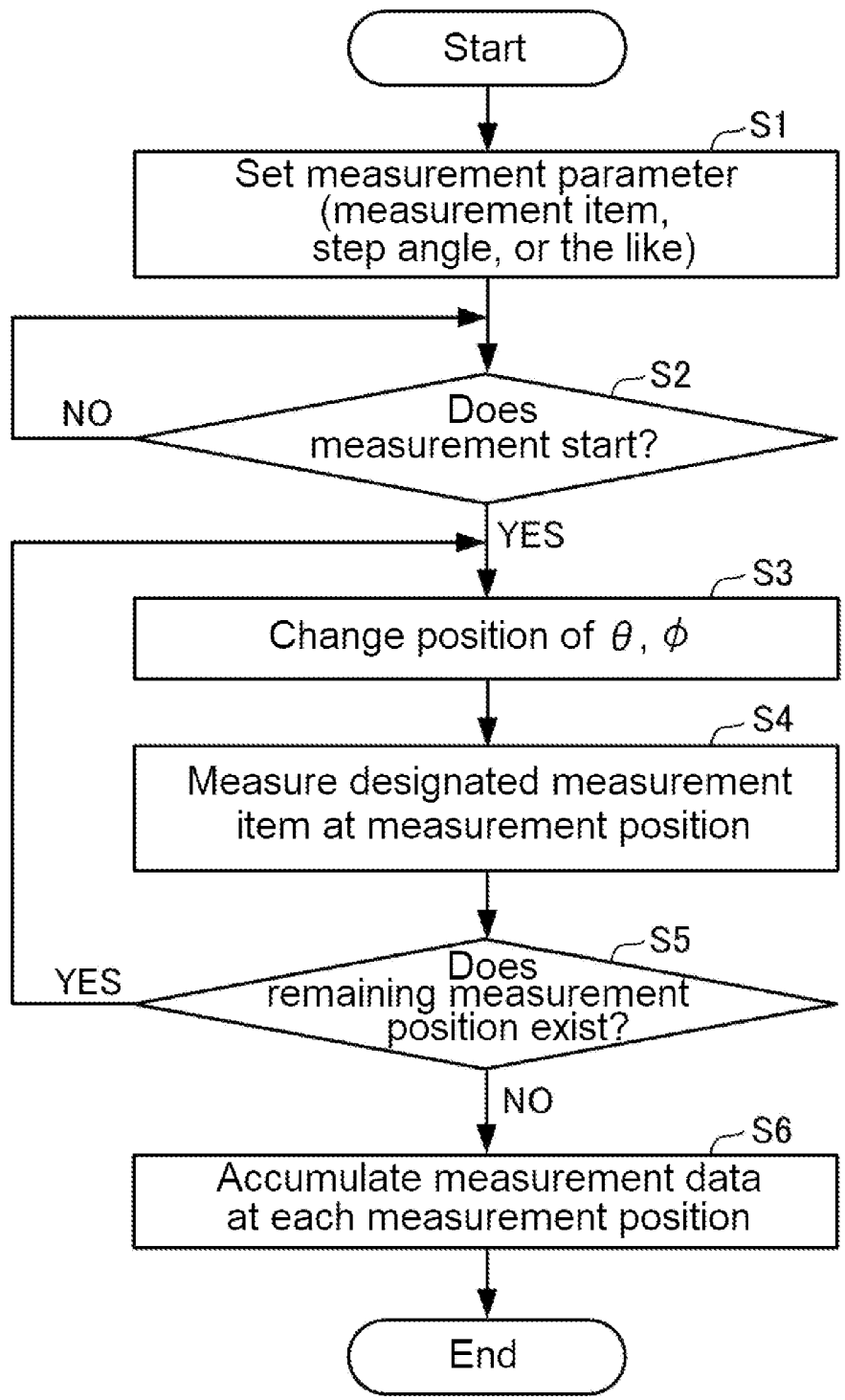
FIG. 11 is a flowchart showing a measurement control operation of TRP of the DUT by an integrated control device of the measuring device according to the embodiment of the present invention.

In order to start the rotation speed control in step S20, the rotation speed management control unit 18b determines whether or not YES is determined in each of step S2 and step S5 during the measurement operation control shown in FIG. 11 (step S12). That is, in a case where it is determined that the measurement start operation is performed in step S2 of FIG. 11 or the remaining measurement position exists in step S5 (YES in step S12), the rotation speed management control unit 18b proceeds to the rotation speed control in step S20.

In the rotation speed control in step S20, the rotation speed management control unit 18b first reads the step angle set in step S1 of FIG. 11 (step S13).

Next, the rotation speed management control unit 18b reads the rotation speed data stored in the rotation speed management table 16b so as to correspond to the step angle using the step angle read in step S13 as a key (step S14). Further, the rotation speed management control unit 18b rotationally drives the drive motor 56g at the rotation speed corresponding to the rotation speed data read in step S14 (step S15).

Subsequently, the rotation speed management control unit 18b determines whether or not the movement angle of the biaxial positioner reaches the step angle set in step S1 (refer to FIG. 11) (step S16). Here, in a case where it is determined that the movement angle of the biaxial positioner does not reach the set step angle (NO in step S16), the rotation speed management control unit 18b continues the rotation drive of the drive motor 56g in step S15.

On the other hand, in a case where it is determined that the movement angle of the biaxial positioner reaches the set step angle (YES in step S16), the rotation speed management control unit 18b continues the process subsequent to step S4 in FIG. 11.

The rotation speed control of the drive motor 56g (step S20) shown in FIG. 12 is performed for each step angle section until the remaining measurement position does not exist (until it is determined to be NO in step S5 of FIG. 11).

In the rotation speed control of the drive motor 56g in step S20, for example, even in a case where any of step angles of 5 degrees, 10 degrees, 15 degrees, and 30 degrees is set, and the biaxial positioner is moved at the set step angle, the drive motor 56g is rotationally driven at the rotation speed stored in the rotation speed management table 16b so as to correspond to the step angle (see step S13).

The rotation speed stored in the rotation speed management table 16b is a rotation speed which is smaller than the maximum rotation speed of the drive motor 56g for any step angle and becomes optimal for minimizing the time required for the biaxial positioner to move at the step angle (optimal value: refer to FIG. 9).

In the measuring device 1 according to the present embodiment, which moves the biaxial positioner by rotationally drive the drive motor 56g at the rotation speed of the optimal value instead of the maximum rotation speed in a movement section at the step angle, it is possible to solve a problem in that, even though the rotation drive is performed at the maximum rotation speed, the time is not always the shortest.

Figure 13:
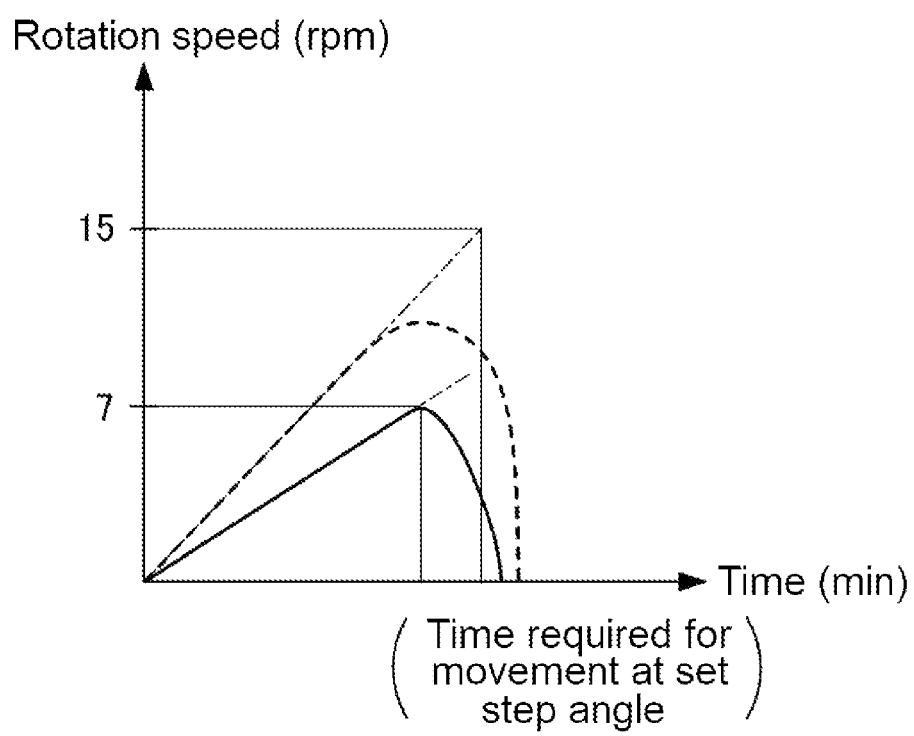
FIG. 13 is a graph explaining an effect of shortening a movement time of the biaxial positioner at the unit step angle based on the rotation speed control of the drive motor shown in FIG. 12.

This point will be described with reference to FIG. 13. FIG. 13 is a diagram showing a relationship (characteristics) between the movement time and the rotation speed of the biaxial positioner at the step angle (specific one section) based on the rotation speed control of the drive motor 56g shown in FIG. 12. In FIG. 13, a solid line shows characteristics in a case where the rotation drive control according to the present embodiment (refer to step S20 in FIG. 12) is applied, and a dotted line shows characteristics in a case where the rotation drive is performed at the maximum rotation speed without applying the rotation drive control according to the present embodiment.

As shown in FIG. 13, in a case where the drive motor 56g is rotationally driven at the maximum rotation speed, the rotation speed rises quickly. However, time is taken for braking (deceleration) control, so that it is not possible to always accomplish the shortest time (refer to FIG. 9). On the other hand, according to the present embodiment in which the rotation speed management table 16b is used to rotationally drive the drive motor 56g with the optimal value according to each step angle, the rotation speed rises slowly and the braking control is also easy. As a result, it is possible to realize the movement in a short time as compared with the case where the rotation drive is performed at the maximum rotation speed (refer to also a shaded portion in FIG. 9).

In the embodiment (refer to FIG. 12), an example is described in which the rotation speed control is performed to optimize the rotation speed of the drive motor 56g in a case where the biaxial positioner is moved by one step angle by using the rotation speed management table 16b. The present invention is not limited thereto, a configuration may be provided in which the same rotation speed control is applied to the drive motor 56f or both the drive motors 56f and 56g.

Regarding the former configuration, control may be performed to rotationally drive the drive motor 56f at an optimal value in a case where the biaxial positioner is moved at the step angle by providing, instead of the rotation speed management table 16b (first rotation speed management table), the second rotation speed management table which manages the rotation speed (optimal value) of the drive motor 56f, which can minimize the movement time of the biaxial positioner 56 in each step section to correspond to each step angle (corresponding to φ in FIG. 7) of the azimuth axis, for example, 5 degrees, 10 degrees, 15 degrees, or 30 degrees.

Further, regarding the latter configuration, instead of the first rotation speed management table and the second rotation speed management table, a second rotation speed management table may be adopted which manages the rotation speed (optimal value) of the drive motor 56g and the drive motor 56f, which can minimize the movement time of the biaxial positioner 56 in each step section to correspond to each step angle θ of the roll axis and each step angle φ of the azimuth axis. In the configuration, the rotation speed management control unit 18b can rotationally drive the drive motors 56f and 56g with the respective optimal values in a case where the biaxial positioner is moved at any step angle in the θ or φ direction.

As described above, according to the present embodiment, there is provided a measuring device 1 includes a biaxial positioner (DUT scanning mechanism) 56 that is provided in an internal space 51 of an OTA chamber 50 and includes an azimuth axis and a roll axis each of which can be rotationally driven by drive motors 56f and 56g, and rotates a DUT 100 to sequentially face a plurality of preset directions of a spherical coordinate system using a center of the spherical coordinate system as a reference point; an NR system simulator 20 that is connected to a test antenna 5 in the internal space 51; an integrated control device 10 that controls the NR system simulator 20 to perform a measurement operation of transmitting a test signal from the test antenna 5 to the DUT 100, receiving the measured signal transmitted from the DUT 100 which receives the test signal, by the test antenna 5, and measuring a measurement item, such as TRP, related to the DUT 100 based on the received measured signal, at each measurement position corresponding to each of the plurality of directions; and a rotation speed management control unit 18b that controls the rotation speed of the drive motor 56g to be a rotation speed which shortens time required for the biaxial positioner 56 to move at a step angle in a case where the biaxial positioner 56 is moved as the step angle from the measurement position where the measurement is completed to the measurement position where next measurement is performed during the measurement of the measurement item, such as TRP.

With the configuration, in the measuring device 1 according to the present embodiment, it is possible to shorten the movement time of the biaxial positioner 56 at the step angle by controlling the rotation speed of the drive motor 56g, so that it is possible to shorten the total measurement time of the item, such as TRP, of the DUT 100 over the plurality of set measurement positions, compared to a case where the drive motor 56g is always rotationally driven at the maximum speed during the movement at the step angle.

Further, the measuring device 1 according to the present embodiment further includes a rotation speed management table 16b that stores the rotation speed of the drive motor 56g, which can minimize a movement time of the biaxial positioner 56 at each step angle, so as to correspond to a plurality of the different step angles; and setting control unit 18a that sets the step angle, in which, in a case where the biaxial positioner 56 is moved at the step angle set by the setting control unit 18a, the rotation speed management control unit 18b rotationally drives the drive motor 56g at the rotation speed stored in the rotation speed management table 16b so as to correspond to the set step angle.

With the configuration, in the measuring device 1 according to the present embodiment, it is possible to easily realize optimization of the rotation speed of the drive motor 56g that minimizes the movement time of the biaxial positioner 56 at the step angle by using the rotation speed management table 16b.

Further, in the measuring device 1 according to the present embodiment, the biaxial positioner 56 includes a first drive motor 56f that rotationally drives the azimuth axis and a second drive motor 56g that rotationally drives the roll axis, and the rotation speed management table 16b stores a rotation speed of the drive motor 56f which can minimize the movement time of the biaxial positioner 56 at of each step angle, a rotation speed of the drive motor 56g, or both the rotation speeds of the drive motor 56f and the rotation speed of the drive motor 56g so as to correspond to the plurality of step angles.

With the configuration, in the measuring device 1 according to the present embodiment, in addition to management in which the rotation speeds of the drive motor 56f that rotationally drives the azimuth axis and the drive motor 56g that rotationally drives the roll axis are individually optimized, management in which the rotation speeds of both the drive motor 56f and the drive motor 56g are simultaneously optimized is possible. Therefore, it is possible to shorten the total measurement time of the measurement item, such as TRP, of DUT 100.

Further, in the measuring device 1 according to the present embodiment, the integrated control device 10 is configured to control the NR system simulator 20 so as to measure Total Radiated Power (TRP). With the configuration, in the measuring device 1 according to the present embodiment, in TRP measurement in which the number of measurement positions is enormous, it is possible to significantly shorten the total measurement time overall the measurement positions due to accumulation of effects of shortening the movement time of the biaxial positioner 56 per unit movement angle.

Further, in the measuring device 1 according to the present embodiment, the rotation speed management control unit 18b controls the rotation speed of the drive motor 56g to be an optimal rotation speed in order to minimize the time required for the biaxial positioner 56 to move at the step angle. With the configuration, in the measuring device 1 according to the present embodiment, it is possible to minimize the movement time of the biaxial positioner 56 at the step angle by optimizing the rotation speed of the drive motor 56g, so that it is possible to shorten the total measurement time of a specific item of the DUT 100 over the plurality of set measurement positions, compared to a case where the drive motor 56g is always rotationally driven at the maximum speed during the movement at the step angle.

Further, according to the present embodiment, there is provided a mobile terminal testing method of a mobile terminal testing device including a biaxial positioner (DUT scanning mechanism) 56 that is provided in an internal space 51 of an OTA chamber 50 and includes an azimuth axis and a roll axis each of which can be rotationally driven by drive motors 56f and 56g, and rotates a DUT 100 to sequentially face a plurality of preset directions of a spherical coordinate system using a center of the spherical coordinate system as a reference point; an NR system simulator 20 that is connected to a test antenna 5 in the internal space 51; and an integrated control device 10 that controls the NR system simulator 20 to perform a measurement operation of transmitting a test signal from the test antenna 5 to the DUT 100, receiving the measured signal transmitted from the DUT 100 which receives the test signal, by the test antenna 5, and measuring a measurement item, such as TRP, related to the DUT 100 based on the received measured signal, at each measurement position corresponding to each of the plurality of directions, the mobile terminal testing method including: a movement control step (S3) of moving the biaxial positioner 56 at an angle from the measurement position where the measurement is completed to the measurement position where next measurement is performed as a step angle during the specific measurement item is measured; and a rotation speed control step (S20) of controlling a rotation speed of the drive motor 56g to a rotation speed which shortens a time required for the biaxial positioner 56 to move at the step angle in a case where the biaxial positioner 56 is moved in the movement control step.

With the configuration, in the mobile terminal testing method according to the present embodiment, it is possible to shorten the movement time of the biaxial positioner 56 at the step angle by controlling the rotation speed of the drive motor 56g, so that it is possible to shorten the total measurement time of the item, such as TRP, of the DUT 100 over the plurality of set measurement positions, compared to a case where the drive motor 56g is always rotationally driven at the maximum speed during the movement at the step angle.

Further, the mobile terminal testing method according to the present embodiment further includes a step (S11) of preparing a rotation speed management table 16b that stores the rotation speed of the drive motor 56g, which can minimize a movement time of the biaxial positioner 56 at each step angle, so as to correspond to a plurality of the different step angles, in which the rotation speed control step includes a setting step (S11) of setting the step angle, and a drive step (S12, S13) of rotationally driving the drive motor 56g at the rotation speed stored in the rotation speed management table 16b so as to correspond to the set step angle in a case where the biaxial positioner 56 is moved at the step angle set in the setting step.

With the configuration, in the mobile terminal testing method according to the present embodiment, it is possible to easily realize optimization of the rotation speed of the drive motor 56g that minimizes the movement time of the biaxial positioner 56 at the step angle by using the rotation speed management table 16b.

INDUSTRIAL APPLICABILITY

As described above, the mobile terminal testing device and the mobile terminal testing method according to the present invention have advantages of capable of optimizing a rotation speed of a drive motor related to movement of a positioner by a unit movement angle, and capable of shortening a total measurement time of the mobile terminal over all measurement positions, thereby being useful for a mobile terminal testing device and a mobile terminal testing method for performing measurement of TRP or the like related to a mobile terminal by exchanging signals while changing an angle of a positioner on which the mobile terminal is installed under OTA environment.

DESCRIPTION OF REFERENCE NUMERALS AND SIGNS

1: Measuring device (mobile terminal testing device)
5: Test antenna
10: Integrated control device (measurement control means)
16: DUT scanning control unit
16b: Rotation speed management table
18a: Setting control unit (setting means)
18b: Rotation speed management control unit (rotation speed control means)
20 NR system simulator (simulated measuring device)
50: OTA chamber (radio anechoic box)
51: Internal space 56: DUT scanning mechanism (biaxial positioner)
56f, 56g: Drive motor
100: DUT (Device Under Test, mobile terminal)

What is claimed is:

1. A mobile terminal testing device comprising:
a positioner that includes an azimuth axis and a roll axis each of which can be rotationally driven by respective drive motors, and rotates a mobile terminal which is a device under test to sequentially face a plurality of preset directions of a spherical coordinate system using a center of the spherical coordinate system as a reference point;
a simulated measuring device that is connected to a test antenna; and
a processor configured to:
control the simulated measuring device to perform a measurement operation of transmitting a test signal from the test antenna to the mobile terminal, receive a measured signal transmitted from the mobile terminal by the test antenna, and measure a specific measurement item related to the mobile terminal based on the received measured signal at each measurement position corresponding to each of the plurality of directions; and
control a rotation speed of the drive motor to be a rotation speed which is lower than a maximum rotation speed and to reduce a time required for the positioner to move at a unit movement angle relative to a prior rotation speed, from a first measurement position where the measurement is completed to a second measurement position where a next measurement is to be performed by the unit movement angle during the specific measurement item is measured.

2. The mobile terminal testing device according to claim 1, further comprising:
a rotation speed management table that stores rotation speeds of the drive motors, which can minimize movement times of the positioner by each unit movement angle, wherein the rotation speeds correspond to each of a plurality of different unit movement angles;
wherein the processor is configured to set the unit movement angle, and
wherein when the positioner is moved to the second measurement position by the unit movement angle, the processor is configured to rotationally drive the drive motors at a rotation speed that corresponds to the set unit movement angle according to the rotation speed management table.

3. The mobile terminal testing device according to claim 2, wherein
the positioner includes a first drive motor that rotationally drives the azimuth axis and a second drive motor that rotationally drives the roll axis, and
the rotation speed management table stores rotation speeds of the first drive motor, rotation speeds of the second drive motor, or both rotation speeds of the first drive motor and the second drive motor,
wherein the processor is configured to set rotation speeds of the first and second drive motors to minimize the movement time for the positioner to move to a next measurement position by each unit movement angle, wherein the rotation speeds of the first and second drive motors correspond to the unit movement angle.

4. The mobile terminal testing device according to claim 1, wherein the processor is configured to control the simulated measuring device so as to measure Total Radiated Power (TRP) as the specific measurement item.

5. The mobile terminal testing device according to claim 1, wherein the processor is configured to control the rotation speed of the drive motor to be an optimal rotation speed to minimize the time required for the positioner to move at the unit movement angle.

6. The mobile terminal testing device according to claim 1, further comprising:
a radio anechoic box including an internal space,
wherein the positioner and the test antenna are provided in the internal space.

7. A mobile terminal testing method of a mobile terminal testing device, which includes a positioner that includes an azimuth axis and a roll axis each of which can be rotationally driven by respective drive motors, and rotates a mobile terminal which is a device under test to sequentially face a plurality of preset directions of a spherical coordinate system using a center of the spherical coordinate system as a reference point, a simulated measuring device that is connected to a test antenna, and a processor configured to control the simulated measuring device to perform a measurement operation of transmitting a test signal from the test antenna to the mobile terminal, to receive a measured signal transmitted from the mobile terminal which receives the test signal by the test antenna, and to measure a specific measurement item related to the mobile terminal based on the received measured signal at each measurement position corresponding to each of the plurality of directions, the mobile terminal testing method comprising:
a movement control step of moving the positioner from a measurement position where the measurement is completed to a second measurement position where a next measurement is performed by a unit movement angle during the specific measurement item is measured; and
a rotation speed control step of controlling a rotation speed of the drive motor so as to reduce a time required for the positioner to move to the second measurement position by the unit movement angle relative to a prior rotation speed, when the positioner is moved in the movement control step.

8. The mobile terminal testing method according to claim 7, further comprising:
a step of preparing a rotation speed management table that stores rotation speeds of the drive motors, which can minimize a movement time of the positioner by each unit movement angle, wherein the rotation speeds correspond to a plurality of the different unit movement angles,
wherein the rotation speed control step includes:
a setting step of setting the unit movement angle; and
a drive step of rotationally driving the drive motors at one of the rotation speeds stored in the rotation speed management table, wherein the one rotation speed corresponds to the set unit movement angle when the positioner is moved to the second measurement position by the unit movement angle set in the setting step.

* * * * *